(12) United States Patent
Naito et al.

(10) Patent No.: US 7,978,034 B2
(45) Date of Patent: Jul. 12, 2011

(54) ELECTROMECHANICAL ELEMENT AND ELECTRONIC EQUIPMENT USING THE SAME

(75) Inventors: Yasuyuki Naito, Osaka (JP); Yoshito Nakanishi, Osaka (JP)

(73) Assignee: Panasonic Corporation, Osaka (JP)

( * ) Notice: Subject to any disclaimer, the term of this patent is extended or adjusted under 35 U.S.C. 154(b) by 158 days.

(21) Appl. No.: 12/304,757

(22) PCT Filed: Jun. 14, 2007

(86) PCT No.: PCT/JP2007/062042
§ 371 (c)(1),
(2), (4) Date: Dec. 13, 2008

(87) PCT Pub. No.: WO2007/145294
PCT Pub. Date: Dec. 21, 2007

(65) Prior Publication Data
US 2009/0321232 A1 Dec. 31, 2009

(30) Foreign Application Priority Data
Jun. 15, 2006 (JP) .................................. 2006-166062

(51) Int. Cl.
*H01H 51/22* (2006.01)
(52) U.S. Cl. ......................................... 335/78; 200/181
(58) Field of Classification Search ................. 335/78; 200/181
See application file for complete search history.

(56) References Cited

U.S. PATENT DOCUMENTS

| | | | |
|---|---|---|---|
| 6,720,851 B2 * | 4/2004 | Hallbjorner et al. | 335/78 |
| 7,053,736 B2 * | 5/2006 | Nelson | 335/70 |
| 7,342,472 B2 * | 3/2008 | Charvet | 335/78 |
| 7,427,797 B2 | 9/2008 | Obguro et al. | |
| 7,515,023 B2 * | 4/2009 | Nakatani et al. | 335/78 |
| 7,545,246 B2 * | 6/2009 | Kim et al. | 335/78 |
| 2005/0030438 A1 | 2/2005 | Nishioka | |
| 2006/0087390 A1 | 4/2006 | Yuba et al. | |
| 2006/0098059 A1 | 5/2006 | Obguro et al. | |
| 2007/0278075 A1 * | 12/2007 | Terano et al. | 200/181 |

FOREIGN PATENT DOCUMENTS

| | | |
|---|---|---|
| JP | 10-284763 A | 10/1998 |
| JP | 2000-149751 A | 5/2000 |
| JP | 2001-291463 A | 10/2001 |
| JP | 2005-92175 A | 4/2005 |
| JP | 2006-120449 A | 5/2006 |
| JP | 2006-140271 A | 6/2006 |
| WO | 02-096796 A2 | 12/2002 |

OTHER PUBLICATIONS

International Search Report, Jul. 2007.

* cited by examiner

*Primary Examiner* — Anh T Mai
*Assistant Examiner* — Bernard Rojas
(74) *Attorney, Agent, or Firm* — Pearne & Gordon LLP

(57) ABSTRACT

A quick response/low voltage driven electromechanical switch equipped with a mechanism for adjusting a spring constant of a movable electrode is provided. The electromechanical element includes a first electrode formed on a substrate, a second electrode formed at a predetermined interval to the first electrode so that the interval is changed, and supporting portions for supporting the second electrode, wherein the supporting portions of the second electrode are able to be displaced.

23 Claims, 12 Drawing Sheets

ELECTROMECHANICAL ELEMENT AND ELECTRONIC EQUIPMENT USING THE SAME

TECHNICAL FIELD

The present invention relates to an electromechanical element and, more particularly, a quick response/low voltage driven electromechanical switch equipped with a mechanism for adjusting a spring constant of a movable electrode.

BACKGROUND ART

The electromechanical element has a wide variety of application fields such as radio field, optical field, acceleration sensor, biotechnology, and others. Out of them, this device is applicable to components such as a switch, a filter, and the like for a radio equipment.

Through the spread of information communication devices such as a radio terminal, and the like, a broader band of a frequency used in communication is accelerated from several hundred MH band for a cellular phone, and the like to several GHz band for a wireless LAN, and the like. In the present situation, the terminals that comfort to various communication protocols are employed independently. In the future, the realization of a small-size terminal that can comfort to various communication protocols as one radio terminal is desired. In such a tendency that an increase of the number of passive components such as switches, and the like built in a case of the terminal, a size reduction of the passive components is requested.

In such circumstances, a research and development of a high-frequency electric machine (RF-MEMS: Radio Frequency MEMS) manufactured by the MEMS (Micro Electro Mechanical Systems) technology is stimulated. The "electromechanical switch" denotes a switch that switches a signal propagation path mechanically by moving a micro movable electrode. Its advantage is that high frequency characteristics such as ultra low loss, high isolation, and the like are excellent. Also, since this electromechanical switch can be manufactured by the process that has a good affinity for a RF-IC, such switch can be built in the RF-IC. Therefore, the electromechanical switch is expected as the technology that can contribute largely a downsizing of the radio portion.

As the electromechanical switch in the prior art, the switch set forth in Patent Literature 1 has been known. The electromechanical switch has a membrane-like or a rod-like movable electrode as a simple beam structure or a cantilever structure, and switches a signal propagation path by causing the movable electrode to connect/disconnect to/from a fixed electrode. Most of the electromechanical switches employ an electrostatic force as a driving power source of the membrane or the moving body.

At this point in time, following problems exist in the utilization of the electromechanical switch in radio communication.

In order to acquire the quick response characteristic, a high driving voltage is needed. In order to move a movable electrode that has a finite mass while using an electrostatic force as a driving force, a strong electrostatic force, i.e., a high driving voltage is needed.

That is, when improvement of a response speed is intended, a control voltage for driving the movable electrode must be set to an extremely high potential. In LSI in which a lower power supply voltage is advancing, it is difficult to satisfy such request.

For example, the switch using the semiconductor device in the prior art can get a quick response in order of nanosecond (ns). But the electromechanical switch can get a response merely in order of about several tens µs, and a response speed is very slow.

Most of micro electromechanical switches are of the type whose movable electrode is driven by an external force and then is restored (released) into an original position only by a spring force that the movable electrode itself possesses. Therefore, such a problem existed that, when a spring force is weakened to realize the quick response/low voltage drive, a release speed becomes slow.

In order to solve this problem, as set forth in Patent Literature 1, such an approach can be considered that a spring constant of the movable electrode should be increased by providing a convex structure on the movable electrode.

FIGS. 12A and 12B are views showing an electromechanical switch in the prior art, wherein FIG. 12A is a sectional view showing an OFF state, and FIG. 12B is a perspective view showing an ON state. An electromechanical switch 100 has a configuration of the series type (series-connected type) switch that, when a movable electrode 101 comes in contact with a lower electrode 102, a high-frequency signal is propagated to the output side and, when a contact of the movable electrode 101 to the lower electrode 102 is cut off, a high-frequency signal is cut off. When a configuration as the electromechanical switch shown in FIG. 12A is viewed, the lower electrode 102 on a surface of which an insulating film 103 is formed and the movable electrode 101 that are bridged between posts 104 as the simple beam are provided on a substrate 105 on a surface of which an insulating film is formed. When the electromechanical switch 100 is turned ON, a voltage VON is applied between the movable electrode 101 and the lower electrode 102, as shown in FIG. 12B, and the electromechanical switch 100 is driven toward the lower electrode 102 side by an electrostatic force. In this case, the movable electrode 101 comes in contact with the lower electrode 102, and a propagation path of the high-frequency signal is formed by a capacitive coupling via the insulating film 103. In contrast, when the electromechanical switch 100 is turned OFF, the voltage VON is cut off, as shown in FIG. 12A, and the movable electrode 101 and the lower electrode 102 are set to the same potential. In this case, the movable electrode 101 is driven upward by a spring force that the movable electrode 101 itself possesses and is restored into its original position. Thus, the signal propagation path between the movable electrode 101 and the lower electrode 102 is disconnected.

That is, in this structure, as a first stage, the movable electrode is driven until convex structures come into contact with a lower surface of the movable electrode. In this while, a portion of the movable electrode, which is bridged between the posts, gives a spring constant. Then, as a second stage, a portion of the movable electrode, which is bridged between the convex structures, is driven downward and is brought into contact with the lower electrode. In this while, a portion of the movable electrode, which is bridged between the convex structures, gives a spring constant. Since a length of the portion that is bridged across the hollow portion can be changed in respective stages, a spring constant can be changed and increased. In this case, an increase of a release speed produced by increasing a spring force can be expected.

Patent Literature 1: WO02/96796

DISCLOSURE OF THE INVENTION

Problems that the Invention is to Solve

However, in the structure of the electromechanical switch in the prior art, the operation has two stages in which either the movable electrode comes into contact with the convex structures or not, i.e., two stages in which either the movable electrode is pulled by the pull-in or not.

Meanwhile, according to a change in temperature of the outside air, sometimes it is impossible to ignore a continuous change of a spring constant caused by a thermal expansion of the movable electrode. For example, in recent years attention is directed to the electromechanical switch using the material such as aluminum, or the like on account of its lightweight, but a coefficient of thermal expansion is high and a temperature change due to heat is great. In this case, a continuous change of a spring constant caused by a thermal expansion of the movable electrode must be compensated. However, it is difficult to compensate a change of a spring constant caused due to a change in temperature of the outside air by two-stage control described above.

Also, the influence of such a phenomenon that an attractive force is generated on a contact boundary between the electrodes by a change in humidity to make the release of the movable electrode difficult (sticking) is varied. The reason for this may be considered such that, when humidity is increased, a moisture in the atmosphere is flocculated on the contact boundary by a capillary phenomenon to increase an attractive force (capillary force). Therefore, there is the problem that the driving characteristic is changed by humidity and a failure of the electromechanical element is caused. A function of changing a spring constant of the movable electrode in response to a change in humidity to compensate the drive is needed.

In this manner, in the electromechanical switch in the prior art, a spring force of the movable electrode can be changed only in a discontinuous mode. Therefore, a restoring time required when the movable electrode returns from a contact state to a non-contact state is varied. A variation in a response characteristic due to the variation in restoring time becomes a problem. In this manner, in the electromechanical switch in the prior art, such a problem exists that a fine control responding to a change in temperature and a change in humidity is unfeasible.

The present invention has been made in view of the above circumstances, and it is an object of the present invention to provide an electromechanical element such as an electromechanical switch, or the like equipped with a mechanism for adjusting a spring constant of a movable electrode and having a high-precision response characteristic to an environmental change such as a temperature change, or the like.

Therefore, in the electromechanical element of the present invention, the posts for supporting the first electrode as the movable electrode or the portions for supporting the movable electrode are formed movably. Therefore, a spring constant of the movable electrode is adjusted by applying a releasing force, a tensile force, and a compressive force to the movable electrode, and a time required for the restore, i.e., a response characteristic is adjusted Advantages Of The Invention As described above, according to the present invention, the electromechanical element equipped with a mechanism for adjusting a spring constant of a movable electrode and having a high-precision response characteristic can be realized. Also, the electromechanical element can make a quick response/low voltage drive at a high precision and can be incorporated into a radio terminal can be realized.

BRIEF DESCRIPTION OF THE DRAWINGS

FIGS. 1A and 1B are sectional views showing a configuration of an electromechanical switch in Embodiment 1 of the present invention, wherein FIG. 1A is a sectional view showing a transition state from ON to OFF, and FIG. 1B is a sectional view showing an OFF state.

FIGS. 3A and 3B are sectional views showing a configuration of an electromechanical switch in Embodiment 2 of the present invention, wherein FIG. 3A is a sectional view showing a transition state from ON to OFF, and FIG. 3B is a sectional view showing an OFF state.

FIGS. 5A and 5B are sectional views showing a configuration of an electromechanical switch in Embodiment 3 of the present invention, wherein FIG. 5A is a sectional view showing a transition state from ON to OFF, and FIG. 5B is a sectional view showing an OFF state.

FIGS. 7A and 7B are sectional views showing a configuration of an electromechanical switch in Embodiment 4 of the present invention, wherein FIG. 7A is a sectional view showing a transition state from ON to OFF, and FIG. 7B is a sectional view showing an OFF state.

FIGS. 9A and 9B are sectional views showing a configuration of an electromechanical switch in Embodiment 5 of the present invention, wherein FIG. 9A is a sectional view showing a transition state from ON to OFF, and FIG. 9B is a sectional view showing an OFF state.

FIGS. 12A and 12B are views showing an electromechanical switch in the prior art, wherein FIG. 12A is a sectional view showing an OFF state, and FIG. 12B is a perspective view showing an ON state.

Figure 1A:
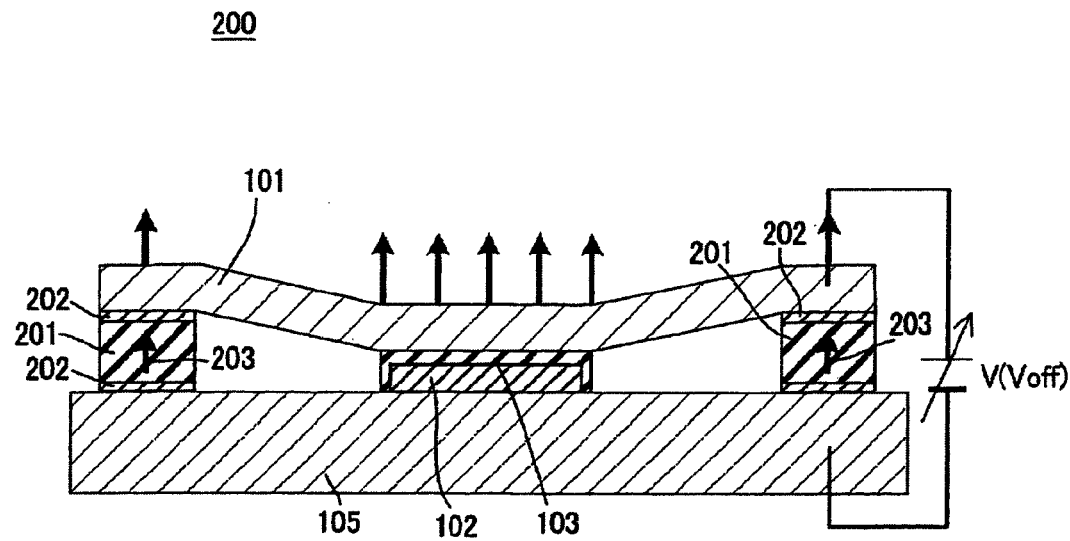

| Description of Reference Numerals | |
|---|---|
| 100, 200, 300, 400, 500, 600, 700 | electromechanical switch |
| 101 | movable electrode |
| 1011 | movable electrode |
| 102 | lower electrode |
| 103 | insulating film |
| 104 | post (supporting body) |
| 105 | substrate |
| 106 | driving electrode |
| 201 | piezoelectric body |
| 202 | adhesion layer/electrode |
| 203 | normal strain |
| 204 | shearing strain |
| 211 | elastic body |
| 301 | releasing force |
| 302 | tensile force |
| 303 | bending force |
| 304 | tensile force |
| 305 | upward oblique force |
| 401 | driving electrode |

-continued

| Description of Reference Numerals | |
|---|---|
| 402 | column post |
| 403 | post |
| 404 | driving electrode |

BEST MODE FOR CARRYING OUT THE INVENTION

Embodiments of the present invention will be explained hereinafter.

Prior to explanation, an outline of the present invention will be explained hereunder.

An electromechanical element of the present invention, includes a first electrode provided on a substrate; a second electrode provided at a predetermined interval to the first electrode so that the interval is changed; and supporting portions which support the second electrode. The supporting portions of the second electrode are able to be displaced.

According to this configuration, the mechanism for adjusting a spring constant of the second electrode can be provided to the electromechanical element. Therefore, the quick response/low voltage driven electromechanical element can be accomplished. Also, because the electromechanical switch can implement a quick response/low voltage drive, such electromechanical switch can be applied to a radio terminal. A higher performance of a radio terminal can be realized.

Also, the present invention includes the electromechanical element in which the supporting portions of the second electrode are displaced in response to a magnitude of an applied voltage.

According to this configuration, the quick response/low voltage driven electromechanical element can be provided easily by adjusting the applied voltage.

Also, the present invention includes the electromechanical element in which an ON/OFF-switching is realized by using the first electrode and the second electrode as input/output terminals.

According to this configuration, the mechanism for adjusting a spring constant of the movable electrode can be provided to the electromechanical element. Therefore, the quick response/low voltage driven electromechanical element can be accomplished. Also, because the electromechanical switch can implement a quick response/low voltage drive, such electromechanical switch can be applied to a radio terminal. A higher performance of the radio terminal can be realized. In this case, the applied voltage to this adjusting mechanism may be applied directly or indirectly to the supporting portions.

Also, the present invention includes the electromechanical element in which the supporting portions have a supporting body, which supports the second electrode, near at least one end of the second electrode.

According to this configuration, an electrostatic force can be applied to the movable electrode, and the portions for supporting the supporting body may be formed movably. The supporting body may be provided on the substrate to support the second electrode. Here, the first post for supporting the second electrode movably and the second post arranged near the first post to displace the second electrode by an electrostatic force may be provided, and the adjusting mechanism may be constructed to adjust the electrostatic force.

Also, the present invention includes the electromechanical element in which the supporting body is able to be displaced to support the second electrode at a different height from a surface of the substrate.

According to this configuration, the supporting body can adjust a position where the second electrode is supported. Therefore, the quick response/low voltage drive can be implemented.

Also, the present invention includes the electromechanical element in which the supporting body is able to be displaced to support the second electrode in a different position in a parallel direction to a surface of the substrate.

According to this configuration, the supporting body can adjust a position where the second electrode is supported. Therefore, the quick response/low voltage drive can be implemented.

Also, the present invention includes the electromechanical element in which the supporting body is able to be displaced to extend the second electrode at an angle of almost 45 degree to the first electrode.

According to this configuration, the second electrode (movable electrode) can be displaced more effectively by moving oblique upward, and the second electrode can be restored easily.

Also, the present invention includes the electromechanical element in which the supporting body has a piezoelectric body.

Also, the present invention includes the electromechanical element in which a side surface of the piezoelectric body is restrained by an elastic body.

According to this configuration, a displacement of the piezoelectric body can be enlarged by a restoring force of the elastic body provided to the sidewall, and a larger force can be applied to the second electrode.

Also, the present invention includes the electromechanical element in which the supporting body is constructed to displace the second electrode by an electrostatic force.

According to this configuration, a displacement of the second electrode can be adjusted by an electrostatic force that is caused in the supporting body.

Also, the present invention includes the electromechanical element in which the supporting portions have a first supporting body that is arranged near at least one end of the second electrode to support the second electrode, and a second supporting body that is arranged near the first supporting body and is constructed to displace the second electrode by an electrostatic force.

According to this configuration, a displacement of the second electrode can be adjusted by an electrostatic force that is caused between the second electrode and the first supporting body.

Also, the present invention includes the electromechanical element in which the second supporting body has a driving electrode that is provided at a predetermined interval to the second electrode so that a potential difference to the second electrode is able to be adjusted.

According to this configuration, a displacement of the second electrode can be adjusted by an electrostatic force that is caused between the second electrode and the second supporting body.

Also, the present invention includes the electromechanical element in which the first supporting body is electrically isolated from the second electrode.

According to this configuration, such a situation can be prevented that the input or output signal to or from the electromechanical element is influenced by the voltage applied to the adjusting mechanism.

Also, the present invention includes the electromechanical element in which the second supporting body is arranged on an outside of a position that opposes to the first electrode.

According to this configuration, the ON/OFF signal can be applied independent of the operation of the adjusting mechanism, and also such a situation can be prevented that the input or output signal to or from the electromechanical element is influenced by the voltage applied to the adjusting mechanism. Since the second electrode as the movable electrode is not formed on the supporting portions around the first electrode as the driving electrode, the second electrode is formed in the air in a movable state, and a larger amount of displacement can be given to the movable electrode by an electrostatic force applied by the first electrode.

Also, the present invention includes the electromechanical element in which the first supporting body is a column-like structure.

Also, the present invention includes the electromechanical element in which the supporting portions have a suspending/supporting portion for suspending the second electrode to have an area that opposes to the first electrode, and a supporting body constructed at a predetermined interval from at least one end of the second electrode and provided on the substrate so that a potential difference to the second electrode is able to adjusted respectively.

Also, the present invention includes the electromechanical element in which the second post is constructed at a predetermined interval to the second electrode so that a potential difference to the second electrode is able to be adjusted.

According to this configuration, a displacement of the second electrode can be adjusted by an electrostatic force that is caused between the second post and the second electrode. Here, it is desirable that an electrostatic force caused between them should be used in a sufficient small range not to exceed a pull-in voltage.

Also, the present invention includes the electromechanical element in which the second post is constructed at a predetermined interval to the first post so that a potential difference to the first post is able to be adjusted.

According to this configuration, a displacement of the second electrode can be adjusted by an electrostatic force that is caused between the second post and the first post.

Also, the present invention includes the electromechanical element in which the first post is electrically isolated from the second electrode.

According to this configuration, such a situation can be prevented that the input or output signal to or from the electromechanical element is influenced by the voltage applied to the adjusting mechanism.

Also, the present invention includes the electromechanical element in which the second post is arranged on an outside of a position that opposes to the first electrode.

According to this configuration, the ON/OFF signal can be applied independent of the operation of the adjusting mechanism, and also such a situation can be prevented that the input or output signal to or from the electromechanical element is influenced by the voltage applied to the adjusting mechanism. Since the second electrode as the movable electrode is not formed on the posts around the first electrode as the driving electrode, the second electrode is formed in the air in a movable state, and a larger amount of displacement can be given to the movable electrode by an electrostatic force applied by the first electrode.

Also, the present invention includes the electromechanical element in which the first post is a column-like structure.

According to this configuration, a change of shape can be easily produced, and adjustment is facilitated.

Also, the present invention includes the electromechanical element in which the supporting portions are constructed by a post having a piezoelectric body respectively, and the adjusting mechanism is constructed to adjust a magnitude of the applied voltage to the piezoelectric body.

According to this configuration, the post can be displaced by the normal strain and the shearing strain of the piezoelectric body. A spring force of the movable electrode can be changed continuously by applying a releasing force, a tensile force, and a compressive force to the movable electrode.

Also, the present invention includes the electromechanical switch in which the posts have an elastic body on a sidewall of the piezoelectric body.

According to this configuration, a displacement of the piezoelectric body can be enlarged by a restoring force of the elastic body provided to the sidewall, and a larger force can be applied to the second electrode.

Also, the present invention includes the electromechanical switch in which the supporting portions are constructed by two piezoelectric bodies that are formed to support both ends of the movable electrode.

According to this configuration, the movable electrode having the fixed or simple beam structure can be obtained with good controllability.

Also, the present invention includes the electromechanical switch in which the piezoelectric body is provided to extend at an angle of almost 45 degree to the fixed electrode.

According to this configuration, the second electrode (movable electrode) can be displaced more effectively by moving oblique upward, and the second electrode can be restored easily.

Also, the present invention includes the electromechanical element in which the second electrode has a H-shaped structure.

According to this configuration, a spring force of the second electrode as the movable electrode can be divided into two stages, and the driving characteristic capable of the quick response/lower voltage drive can be implemented. Also, an area in which the drive electrode and the movable electrode overlap with each other can be increased, and an increase of an electrostatic force along with an increase of an electrostatic capacity can be attained.

Also, the present invention includes the electromechanical element in which the adjusting mechanism constructed such that an amount of displacement is able to be adjusted in response to a using environment is provided.

According to this configuration, even when the material such as aluminum, or the like having a large coefficient of thermal expansion is employed as the electrode material, an amount of displacement can be easily adjusted.

Also, the present invention includes the electromechanical element that further includes a using environment sensing portion; wherein the adjusting mechanism is able to adjust an amount of displacement based on a sensed result of the using environment sensing portion.

Also, the present invention includes the electromechanical element in which the using environment sensing portion has a temperature sensor. Also, the present invention includes the electromechanical element in which the using environment sensing portion has a humidity sensor According to this configuration, the compensation for the temperature, the humidity, or the like can be automated.

Respective embodiments of the present invention will be explained in detail with reference to the drawings hereinafter.

Embodiment 1

An electromechanical switch in Embodiment 1 of the present invention is characterized in that, as shown in FIGS.

1A and 1B, a piezoelectric body is provided to posts as supporting bodies of the electromechanical switch respectively, a movable electrode as a second electrode is displaced in the direction perpendicular to a substrate by a normal strain of the piezoelectric body, and a force for releasing the movable electrode from a fixed electrode as a first electrode (releasing force) can be adjusted by increasing a spring force of the movable electrode.

Figure 1B:
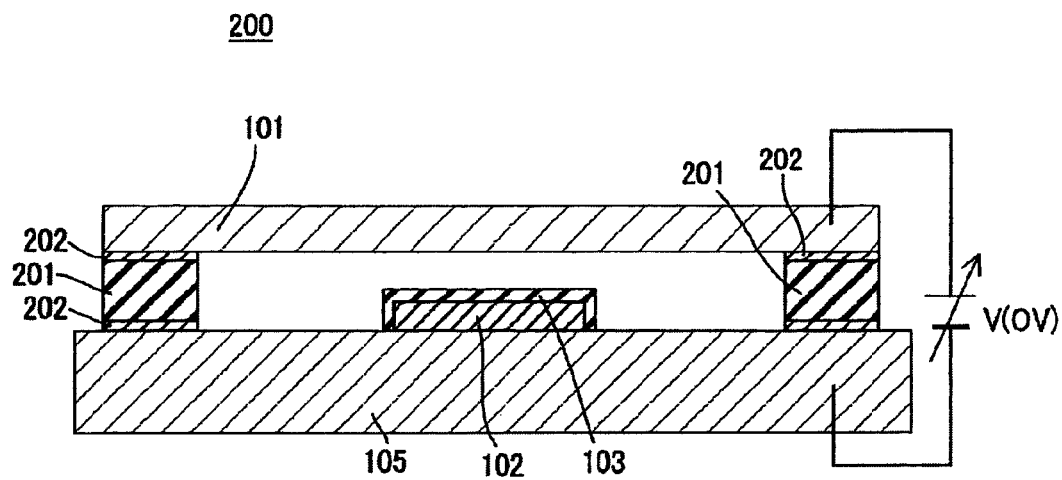
Figure 12A:
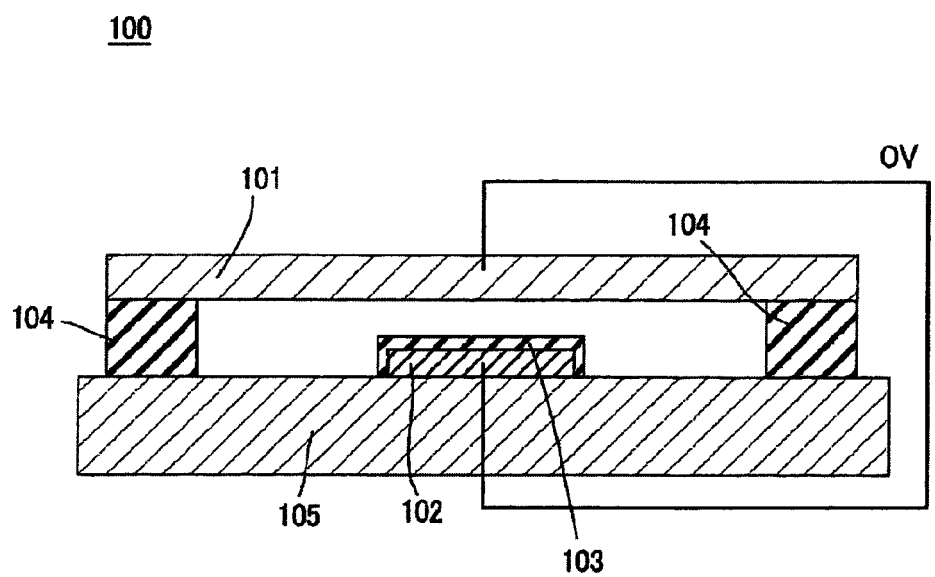
Figure 12B:
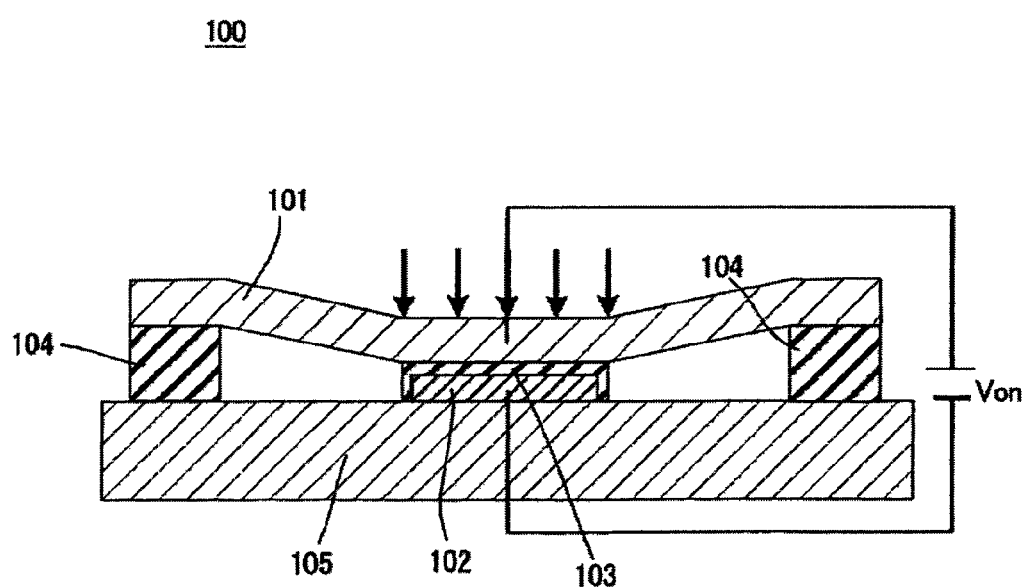

FIGS. 1A and 1B are sectional views showing a configuration of an electromechanical switch in Embodiment 1 of the present invention, wherein FIG. 1A is a sectional view showing a transition state from ON to OFF, and FIG. 1B is a sectional view showing an OFF state. An electromechanical switch 200 illustrated in the present embodiment employs a piezoelectric body 201 as the posts of the electromechanical switch 100 shown in FIGS. 12A and 12B in the prior art, and is constructed such that a voltage can be applied to the piezoelectric body 201 that is put between electrodes (adhesion layer/electrodes) 202 formed via an adhesion layer (not shown). In this case, the present invention is applicable to a shunt (parallel-connected type) switch in which a relationship between the drive and ON/OFF of the movable electrode 101 is opposite to that in the series type.

Figure 2:
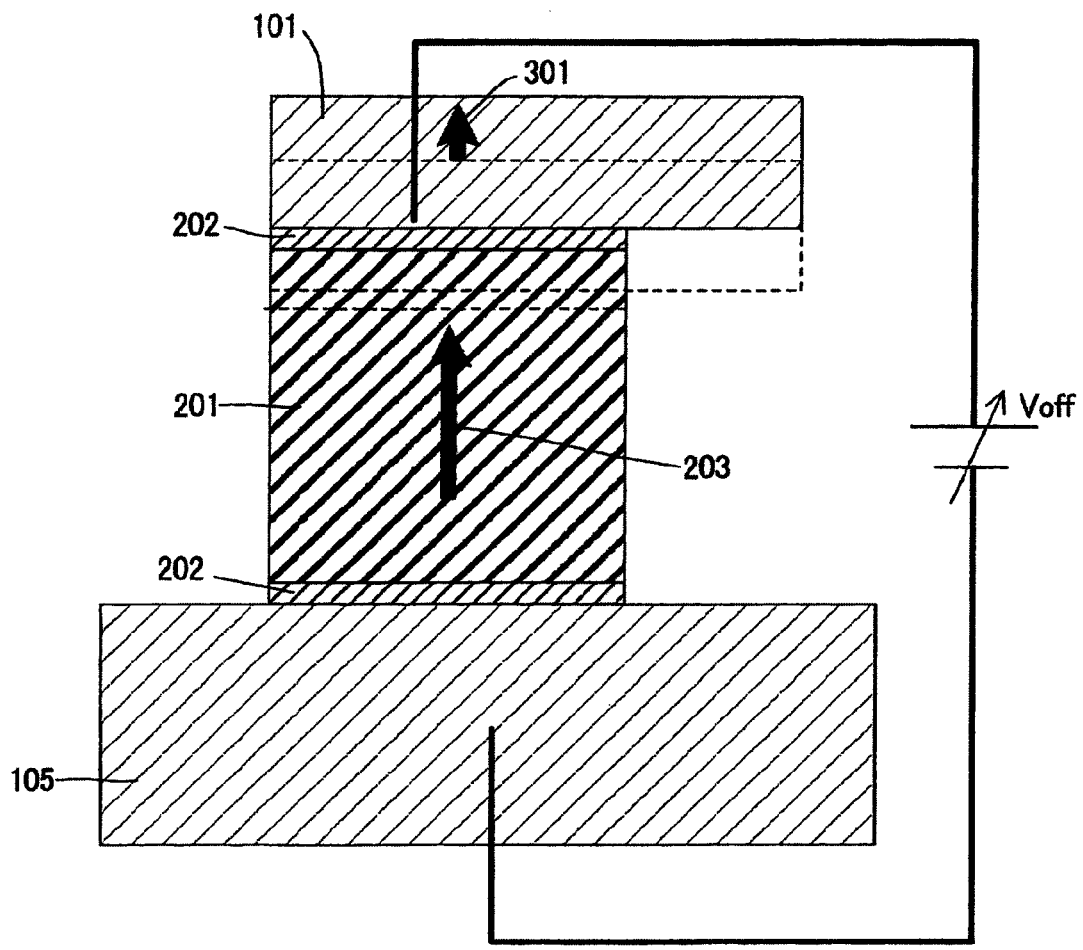
FIG. 2 is a sectional view showing a post of the electromechanical switch in Embodiment 1 of the present invention in an enlarged fashion.

FIG. 2 is an enlarged sectional view showing the post as an adjusting mechanism of the electromechanical switch in Embodiment 1 of the present invention. In a situation that the piezoelectric body 201 is constructed to have a large piezoelectric constant in the parallel direction to the electric field direction, when a voltage VOFF is applied between the electrodes 202, the piezoelectric body 201 is displaced upward by a normal strain 203 that is distorted in the direction perpendicular to the substrate. In this case, a releasing force 301 applied in the direction to release the movable electrode 101 from the lower electrode 102 can be applied to the movable electrode 101.

In the electromechanical switch shown in FIG. 1A, when this switch is switched from an ON state to an OFF state, the posts can be displayed upward from the substrate by applying the voltage VOFF to the piezoelectric body 201, and a spring force can be increased on account of an increase of a displacement of the movable electrode 101 in the vertical direction. An increase of a spring force yields an increase of a releasing force of the movable electrode 101, and a speedup of an OFF operation can be achieved. When the release is completed, the switch goes to an OFF state shown in FIG. 1 FIG. 12B.

This structure is also effective to a speedup of an ON operation. When a direction of the voltage VOFF applied to the piezoelectric body 201 is set in the opposite direction, a direction of the normal strain 203 of the piezoelectric body 201 is reversed, and the movable electrode 101 is displaced to come close to the lower electrode 102 side. In this case, a gap between the movable electrode 101 and the lower electrode 102 can be made small. Since a force for pulling the movable electrode 101 into the lower electrode 102 is increased and a moving distance of the movable electrode 101 is decreased, an increase of the driving force at a time of ON and a quicker response can be attained.

In this event, as the method of applying a voltage to the piezoelectric body 201, there are the method of applying a voltage to the electrodes 202 and the method of applying a voltage to the movable electrode 101/the substrate 105. When the voltage is applied to the substrate 105, an electrical conduction between the substrate 105 and the piezoelectric body 201 must be given previously.

Also, when an alternating voltage is applied to the piezoelectric body 201, the movable electrode 101 is vibrated by using a vibration of the piezoelectric body 201 such that the movable electrode 101 can be released easily from the lower electrode 102. This arrangement is effective in avoiding such a phenomenon that an attractive force is generated on a contact boundary between the movable electrode 101 and the lower electrode 102 to render the release of the movable electrode hard (sticking).

Also, when a driving signal is input to the posts until the drive is completed at a time of ON and a time of OFF, a speedup of the drive can be attained. A driving signal can be input to the posts only when the drive is started. This arrangement is effective in avoiding the sticking at a time of OFF and increasing the driving force at a time of ON.

Also, in the electromechanical switch of the present invention, when a temperature sensing portion and a humidity sensing portion (not shown) are provided, the adjusting mechanism is constructed such that an amount of displacement can be adjusted automatically based on the sensed result being output from the sensing portion as the using environment. As a result, the temperature compensation and the humidity compensation can be automated.

In this manner, according to the mechanism for adjusting a spring constant of the movable electrode of the present invention, the quick response/low voltage driven electromechanical switch can be implemented.

Embodiment 2

The present embodiment is characterized in that the piezoelectric body is formed in the posts of the electromechanical switch, and the movable electrode is displaced with respect to the substrate in the horizontal direction by a shearing strain of the piezoelectric body to increase a spring force of the movable electrode.

Figure 3A:
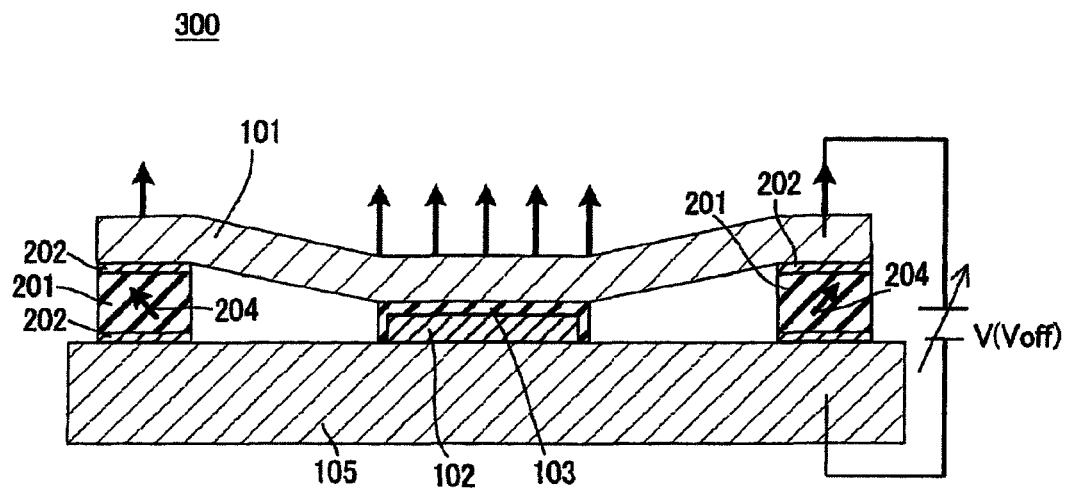
Figure 3B:
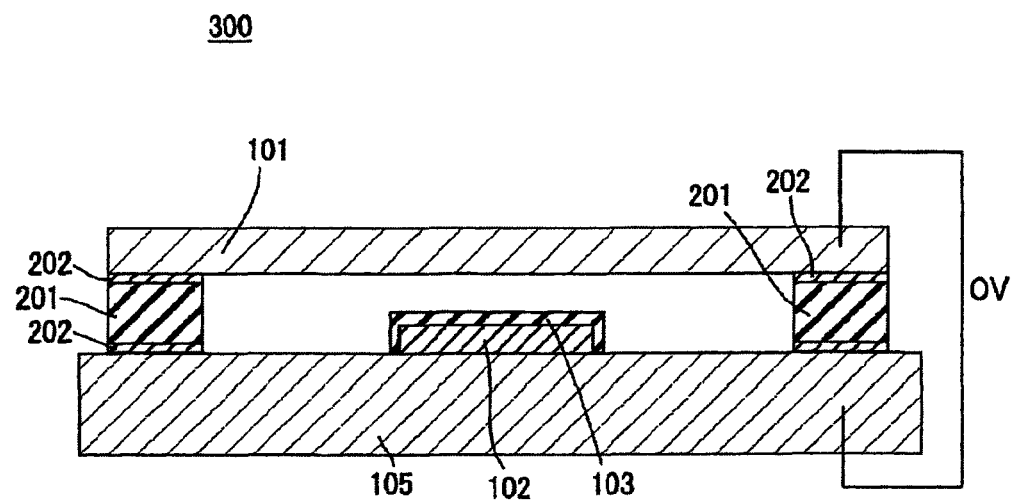

FIGS. 3A and 3B are sectional views showing a configuration of an electromechanical switch in Embodiment 2 of the present invention, wherein FIG. 3A is a sectional view showing a transition state from ON to OFF, and FIG. 3B is a sectional view showing an OFF state. An electromechanical switch 300 shown in the present embodiment has the similar configuration to the electromechanical switch 200 shown in FIG. 2, but is different in that the piezoelectric body 201 generates a large shearing strain.

Figure 4:
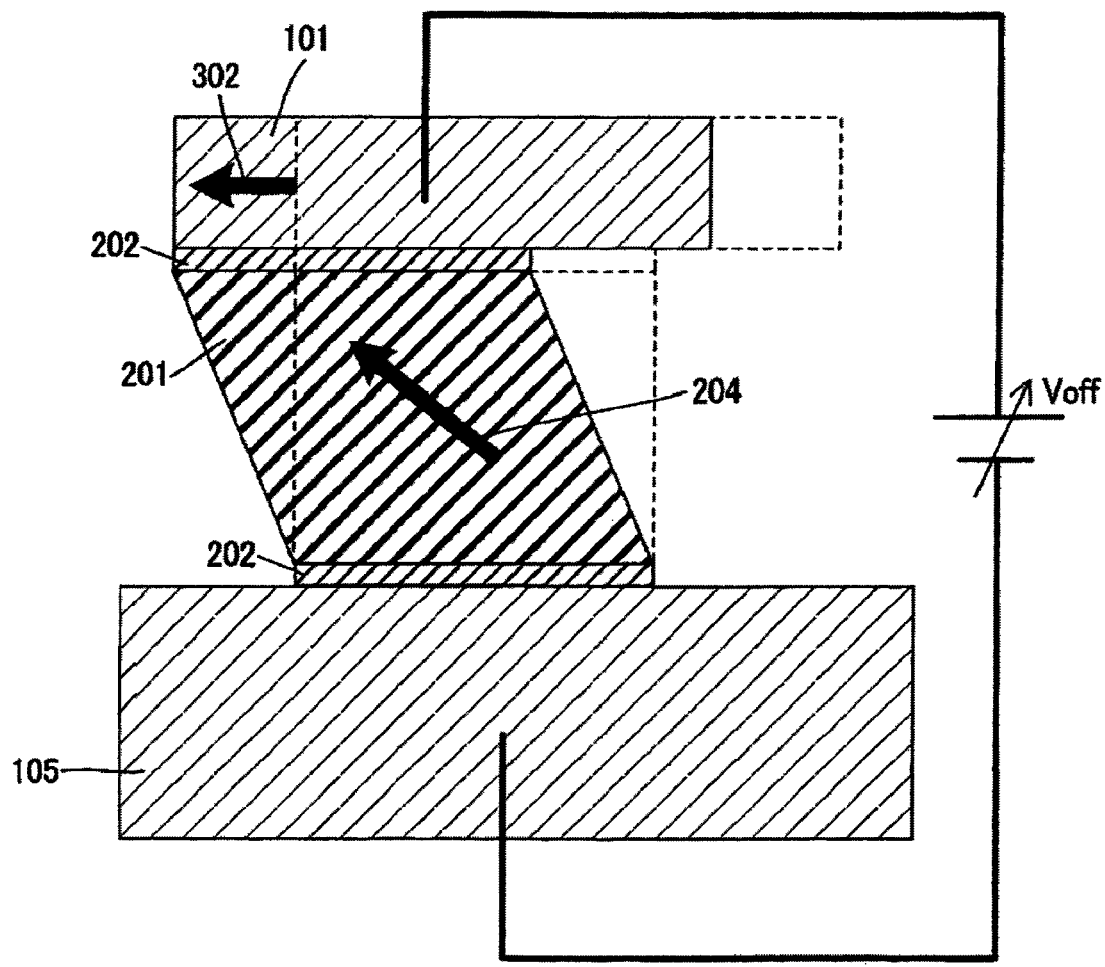
FIG. 4 is a sectional view showing a post of the electromechanical switch in Embodiment 2 of the present invention in an enlarged fashion.

FIG. 4 is a sectional view showing a post of the electromechanical switch in Embodiment 2 of the present invention in an enlarged fashion. In a situation that the piezoelectric body 201 has a large piezoelectric constant in the oblique direction to the electric field direction, when the voltage VOFF is applied between the electrodes 202, the piezoelectric body 201 is displaced in the horizontal direction by a shearing strain 204 that is distorted in the oblique direction to the substrate. In this case, a tensile force 302 applied in the direction to pull the movable electrode 101 from both sides can be applied to the movable electrode 101.

When the electromechanical switch is switched from an ON state to an OFF state shown in FIG. 3A, the post is displaced with respect to the substrate in the horizontal direction by applying the voltage VOFF to the piezoelectric body 201. Thus, a spring force can be increased by a tensile force of the movable electrode 101. An increase of a spring force yields an increase of a releasing force of the movable electrode 101, and a speedup of an OFF operation can be attained. When the release is completed, the switch goes to an OFF state shown in FIG. 3B.

This structure is also effective to a speedup of an ON operation. When a direction of the voltage VOFF applied to the piezoelectric body 201 is set in the opposite direction, a direction of the shearing strain 204 and a direction of the tensile force 302 of the piezoelectric body 201 are reversed, and a force for compressing the movable electrode 101 is applied. In this case, a force for bending the movable electrode 101 in the perpendicular direction is applied. Therefore, when this bending force and the force for pulling the movable electrode 101 into the lower electrode 102 are combined together, an increase of the driving force at a time of ON and a quicker response can be attained.

Embodiment 3

The present embodiment is characterized in that the piezoelectric body and an elastic body are formed in the posts of the electromechanical switch, and the movable electrode is displaced with respect to the substrate in the vertical/horizontal directions by the shearing strain of the piezoelectric body to increase a spring force of the movable electrode.

Figure 5A:
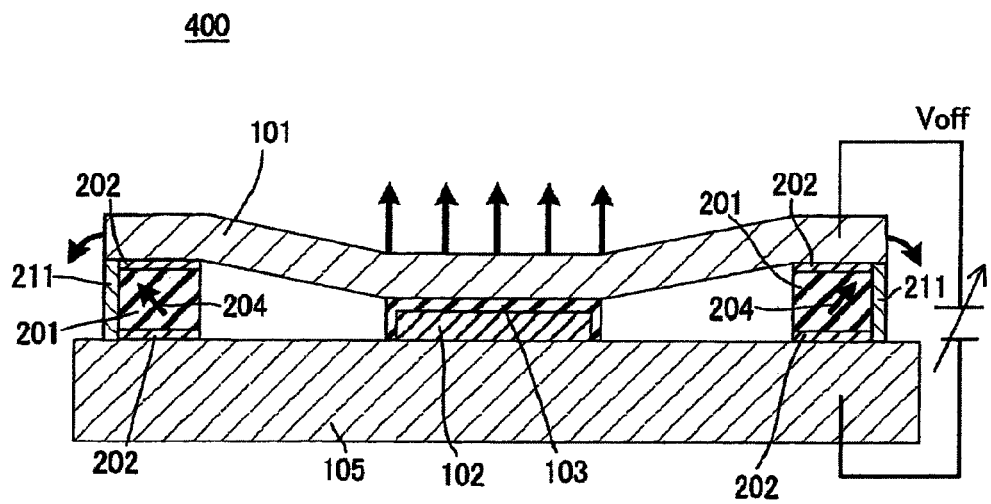
Figure 5B:
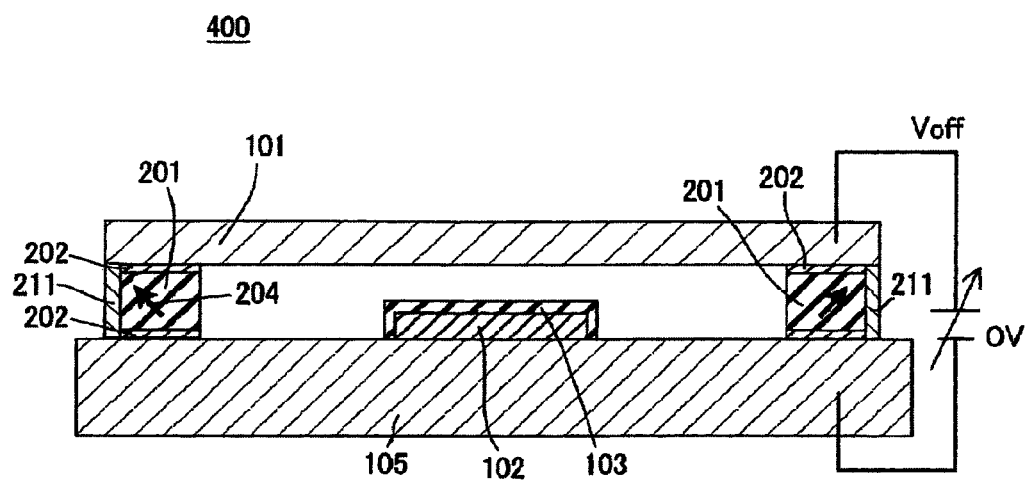

FIGS. 5A and 5B are sectional views showing a configuration of an electromechanical switch in Embodiment 3 of the present invention, wherein FIG. 5A is a sectional view showing a transition state from ON to OFF, and FIG. 5B is a sectional view showing an OFF state. An electromechanical switch 400 illustrated in the present embodiment is different in that an elastic body 211 is provided to side surfaces of the piezoelectric bodies 201 respectively, in addition to the configuration of the electromechanical switch 300 shown in FIG. 3.

Figure 6:
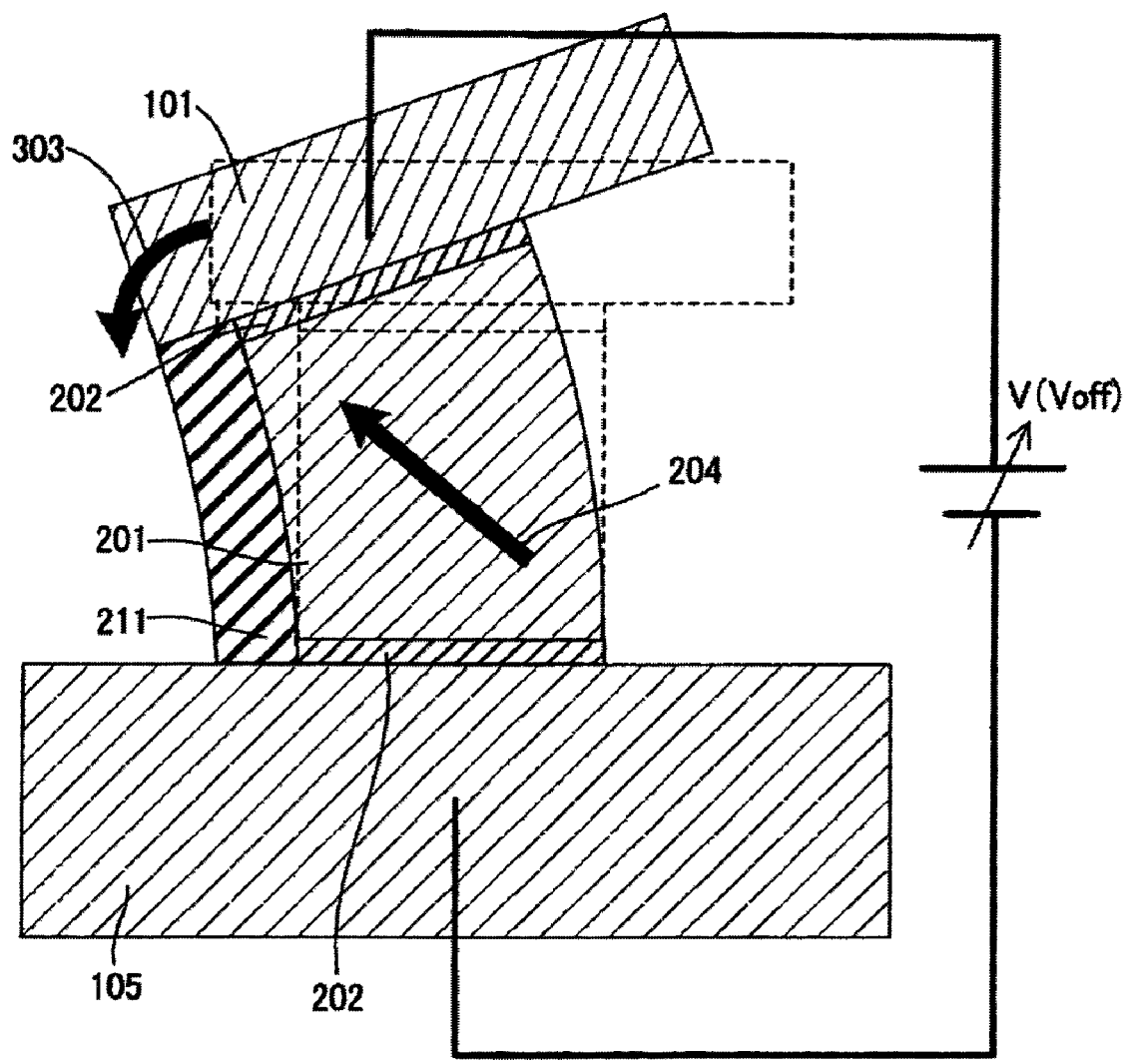
FIG. 6 is a sectional view showing a post of the electromechanical switch in Embodiment 3 of the present invention in an enlarged fashion.

FIG. 6 is a sectional view showing a post of the electromechanical switch in Embodiment 3 of the present invention in an enlarged fashion. In a situation that the piezoelectric body 201 has a large piezoelectric constant in the oblique direction to the electric field direction, when the voltage VOFF is applied between the electrodes 202, the piezoelectric body 201 is displaced in the horizontal direction by the shearing strain 204 that is distorted in the oblique direction to the substrate. Since the side surface of the piezoelectric body 201 is restrained by the elastic body 211, a bending displacement is caused due to a difference between elastic constants of the piezoelectric body 201 and the elastic body 211. The elastic body 211 acts as a mechanism of expanding a displacement of the piezoelectric body 201. In this case, a bending force 303 applied to the movable electrode 101. A releasing force applied in the direction to release the movable electrode 101 from the lower electrode 102 and a tensile force applied in the direction to pull the movable electrode 101 from both sides can be applied to the movable electrode 101.

When the electromechanical switch is switched from an ON state to an OFF state shown in FIG. 5A, the post is bent/displaced by applying the voltage VOFF to the piezoelectric body 201. Thus, a spring force can be increased by a bending force of the movable electrode 101. An increase of a spring force yields an increase of a releasing force of the movable electrode 101, and a speedup of an OFF operation can be attained. When the release is completed, the switch goes to an OFF state shown in FIG. 5B.

This structure is also effective to a speedup of an ON operation. When a direction of the voltage VOFF applied to the piezoelectric body 201 is set in the opposite direction, a direction of the shearing strain 204 and a direction of the bending force 303 of the piezoelectric body 201 are reversed, and a force for compressing and bending downward the movable electrode 101 is applied. In this case, a force for bending the movable electrode 101 in the perpendicular direction is applied. Therefore, when this bending force and the force for pulling the movable electrode 101 into the lower electrode 102 are combined together, an increase of the driving force at a time of ON and a quicker response can be attained.

Embodiment 4

The present embodiment is characterized in that a driving electrode is formed near the posts of the electromechanical switch respectively, and the movable electrode is displaced with respect to the substrate in the horizontal direction by an electrostatic force to increase a spring force of the movable electrode.

Figure 7A:
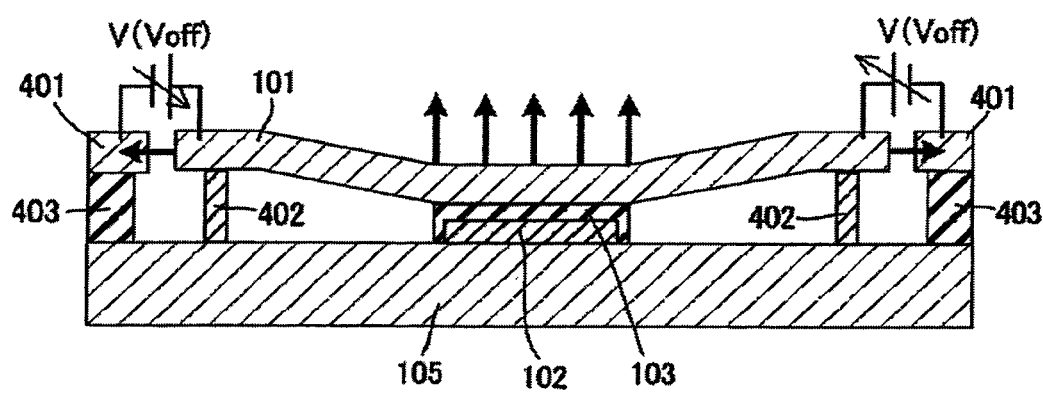
Figure 7B:
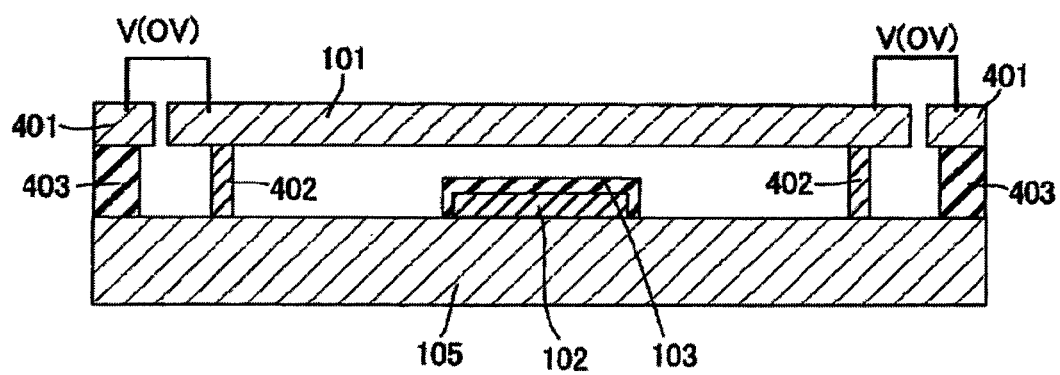

FIGS. 7A and 7B are sectional views showing a configuration of an electromechanical switch in Embodiment 4 of the present invention, wherein FIG. 7A is a sectional view showing a transition state from ON to OFF, and FIG. 7B is a sectional view showing an OFF state. An electromechanical switch 500 shown in the present embodiment is different in that a driving electrode 401 formed on a post 403 is equipped near the posts 104 in the configuration of the electromechanical switch 100 shown in FIGS. 12A and 12B in the prior art respectively.

Figure 8:
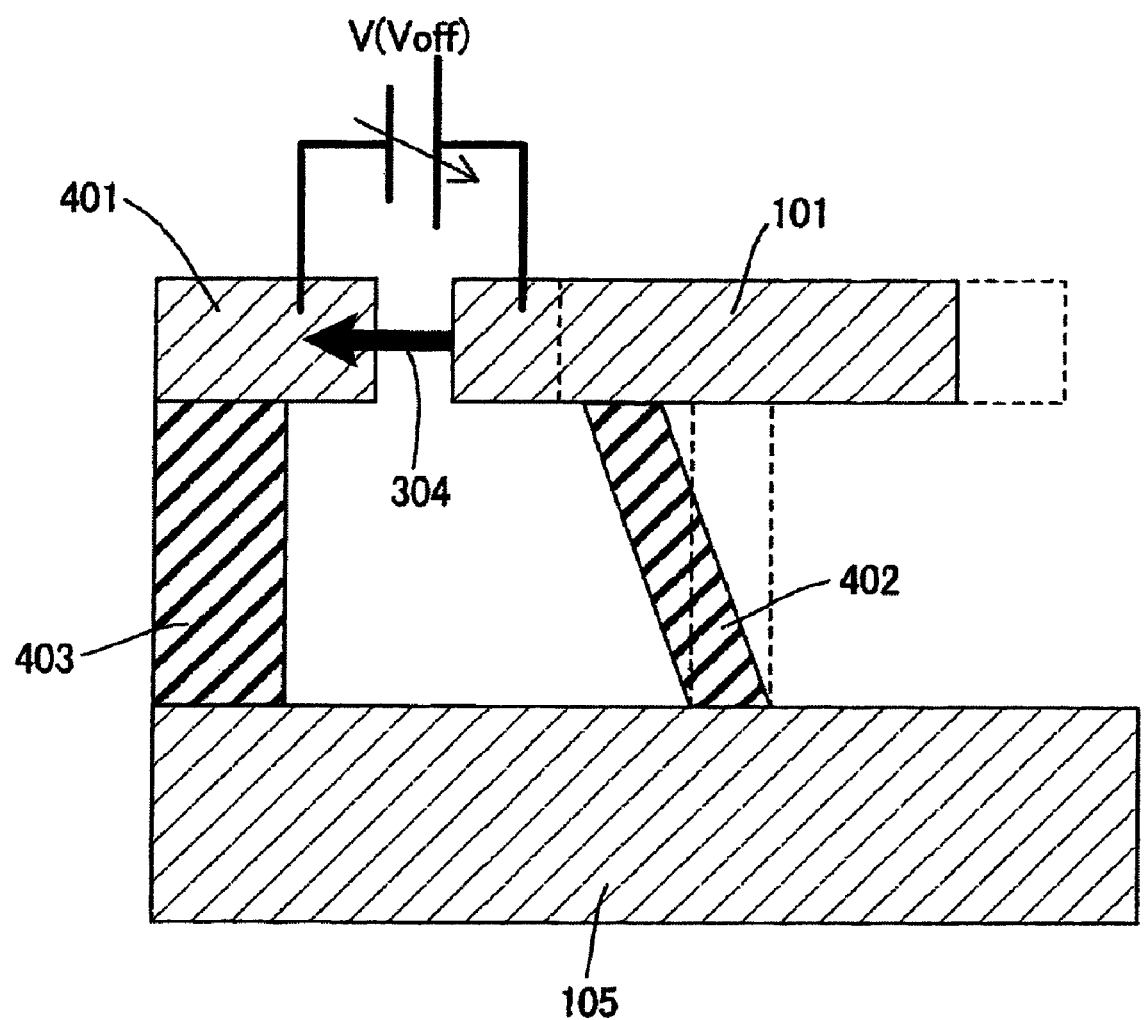
FIG. 8 is a sectional view showing a post of the electromechanical switch in Embodiment 4 of the present invention in an enlarged fashion.

FIG. 8 is a sectional view showing a post of the electromechanical switch in Embodiment 4 of the present invention in an enlarged fashion. When the voltage VOFF is applied between the movable electrode 101 and the driving electrode 401, a force for attracting the movable electrode 101 to the driving electrode 401 side is produced by an electrostatic force. In this case, a tensile force 304 is applied to the movable electrode 101. Thus, the tensile force 304 applied in the direction to pull the movable electrode 101 from both sides can be applied to the movable electrode 101.

When the electromechanical switch is switched from an ON state to an OFF state shown in FIG. 7A, the posts are displaced with respect to the substrate in the horizontal direction by applying the voltage VOFF between the movable electrode 101 and the driving electrode 401. Thus, a spring force can be increased by a tensile force of the movable electrode 101. An increase of a spring force yields an increase of a releasing force of the movable electrode 101, and a speedup of an OFF operation can be attained. When the release is completed, the switch goes to an OFF state shown in FIG. 7B. In this case, posts 402 for supporting the movable electrode 101 can be formed with a flexible structure to deform easily. As shown in FIGS. 7A and 7B, the post can be shaped into the column post 402 that is long and slender in the direction perpendicular to the substrate.

Embodiment 5

The present embodiment is characterized in that the driving electrodes are formed near the movable electrode of the electromechanical switch, and the movable electrode is displaced with respect to the substrate in the vertical/horizontal directions by the electrostatic force to increase a spring force of the movable electrode.

Figure 9A:
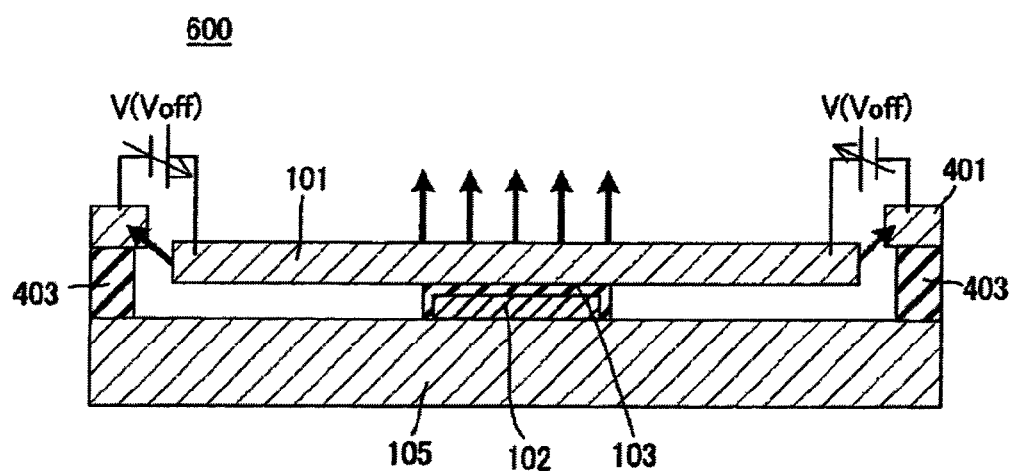
Figure 9B:
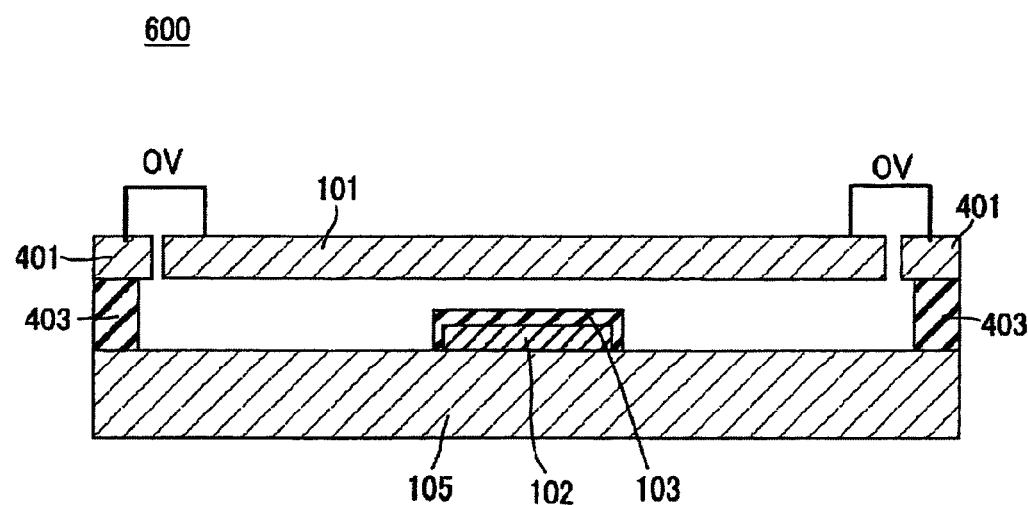

FIGS. 9A and 9B are sectional views showing a configuration of an electromechanical switch in Embodiment 5 of the present invention, wherein FIG. 9A is a sectional view showing a transition state from ON to OFF, and FIG. 9B is a sectional view showing an OFF state. An electromechanical switch 600 shown in the present embodiment is different in that posts 403 in the configuration of the electromechanical switch 500 shown in FIGS. 7A and 7B are not provided. A portion of the movable electrode 101 near the driving electrode 401 is brought into a movable state that is opened in the air.

Figure 10:
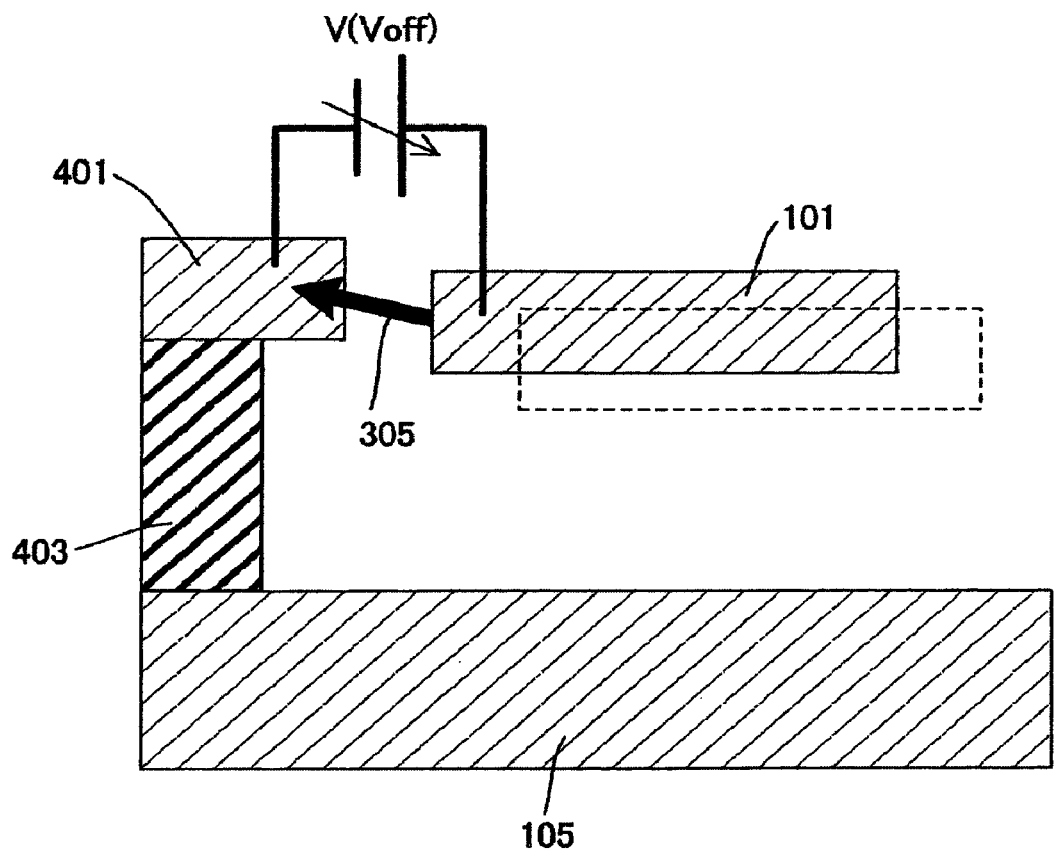
FIG. 10 is a sectional view showing a post of the electromechanical switch in Embodiment 5 of the present invention in an enlarged fashion.

FIG. 10 is a sectional view showing a post of the electromechanical switch in Embodiment 5 of the present invention in an enlarged fashion. When the voltage VOFF is applied between the movable electrode 101 and the driving electrode 401, an upward oblique force 305 for attracting the movable electrode 101 to the driving electrode 401 side is produced by an electrostatic force. In this case, a releasing force applied in the direction to release the movable electrode 101 from the lower electrode 102 and a tensile force applied in the direction to pull the movable electrode 101 from both sides can be applied to the movable electrode 101. Also, an amount of displacement of the movable electrode 101 caused by a releasing force and a tensile force can be increased.

When the electromechanical switch is switched from an ON state to an OFF state shown in FIG. 9A, the movable electrode 101 is displaced in the upward oblique direction by applying the voltage VOFF between the movable electrode 101 and the driving electrode 401. Thus, a spring force can be increased by a force applied to the movable electrode 101 in the upward oblique direction. An increase of a spring force yields an increase of a releasing force of the movable electrode 101, and a speedup of an OFF operation can be attained. When the release is completed, the switch goes to an OFF state shown in FIG. 9B.

Embodiment 6

Figure 11:
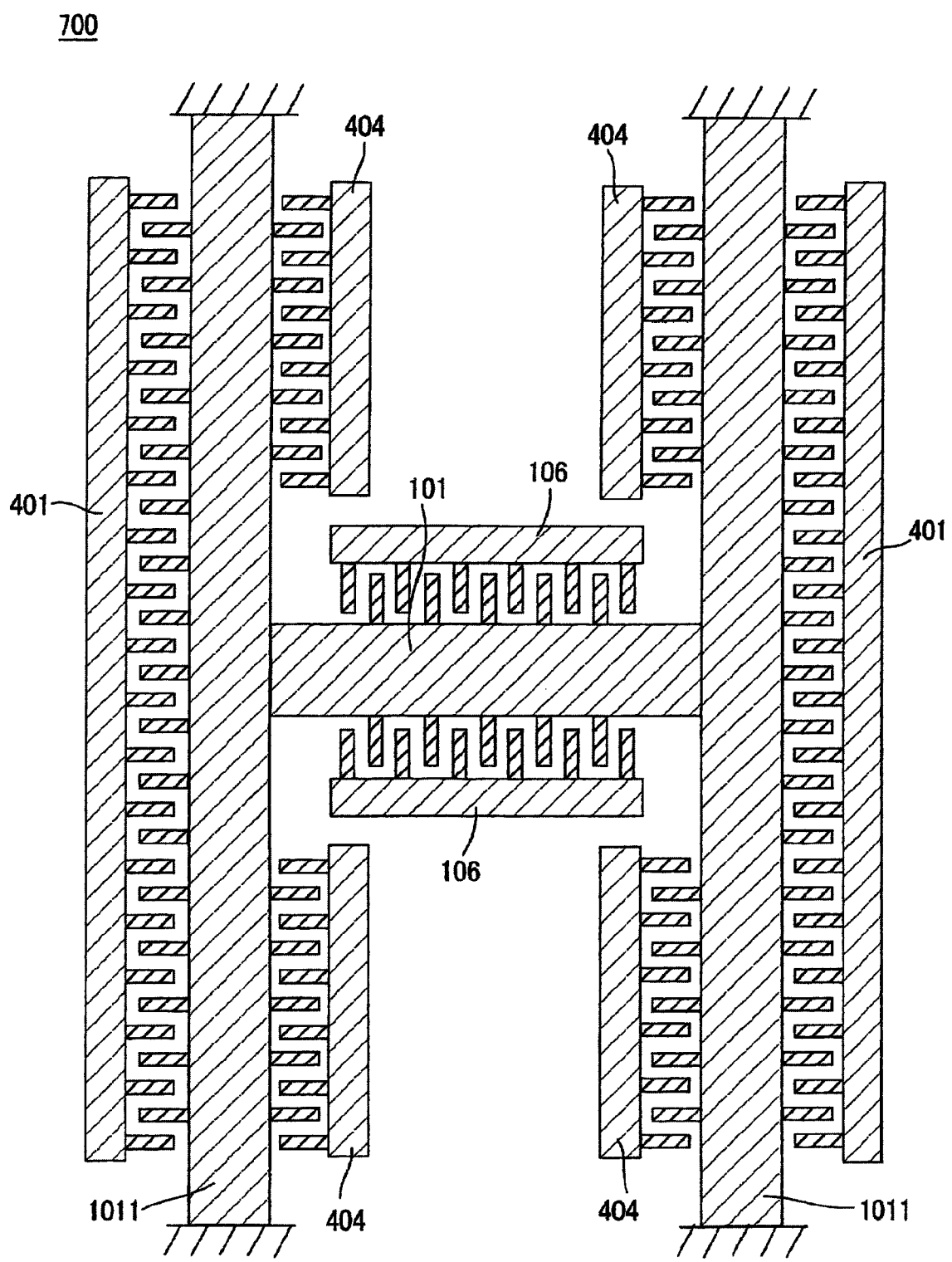
FIG. 11 is a top view showing a configuration of an electromechanical switch in Embodiment 6 of the present invention.

FIG. 11 is a top view showing a configuration of an electromechanical switch in Embodiment 6 of the present invention. An electromechanical switch 700 shown in the present embodiment corresponds to an example of an electrode arrangement of the electromechanical switch 600 shown in FIGS. 9A and 9B.

The movable electrode 101 has fixed-beam type movable electrodes 1011 both sides of which are restrained by the post, and the neighborhood of the driving electrode 401 is set in a movable state in the air. In FIG. 11, the movable electrode 101 has a H-shaped structure. An upward oblique force can be applied to the movable electrode 101 and the movable electrodes 1011 by the driving electrodes 401, 404, 106 that are formed around the movable electrode 101 and the movable electrodes 1011. In order to turn OFF the movable electrode 101 quickly, a driving electrode 106 is provided to give an upward electrostatic force to the movable electrode 101. When an electrostatic force is applied between the driving electrodes 401 and the movable electrodes 1011, the movable electrode 101 can be pulled from both sides. Thus, an increase of a spring force caused due to a tensile force and an upward pulling force and a high-speed release can be attained.

This structure is also effective to a speedup of an ON operation. When an electrostatic force is applied to the driving electrode 404 and the movable electrodes 1011, a force for compressing the movable electrode 101 is applied. In this case, a force for bending the movable electrode 101 in the perpendicular direction is applied. Therefore, when this bending force and the force for pulling the movable electrode 101 into the lower electrode 102 are combined together, an increase of the driving force at a time of ON and a quicker response can be attained.

The movable electrode 101 is constructed to have two spring portions consisting of a portion of the movable electrode 101 and portions of the movable electrodes 1011. Thus, the movable electrode 101 can drive the springs consisting of the movable electrode 101 and the movable electrodes 1011. When a spring constant of the portions of the movable electrodes 1011 is set smaller than that of the portion of the movable electrode 101, the switch can be turned ON quickly by a lower voltage.

As shown in FIG. 11, the electrodes formed between the driving electrode and the movable electrodes are shaped into a comb-toothed structure. Thus, an electrostatic capacity can be increased and also an increase of an electrostatic force can be attained. Also, an area where the driving electrode and the movable electrodes overlap with each other can be increased by increasing the portion of the driving electrode. Also, an increase of an electrostatic force along with an increase of an electrostatic capacity can be attained. In this case, only the spring of the movable electrode 101 is driven at a time of ON while fixing the movable electrodes 1011 by an electrostatic force generated by the driving electrode 401 and the driving electrodes 404, whereas a tensile force of the driving electrode 401 can be applied at a time of OFF.

Also, when only the spring of the movable electrode 101 is driven and the movable electrode 101 is fixed on the lower electrode 102 at a time of ON while fixing the movable electrodes 1011 by an electrostatic force generated by the driving electrodes 401 and the driving electrodes 404, the movable electrodes 1011 are displaced toward the lower electrode 102 as soon as the fixing of the movable electrodes 1011 is released. In this case, an angle at which the movable electrodes 1011 are bent into the vertical direction is made sharp, and as a result a spring force can be increased. In addition to this, when a tensile force of the driving electrode 401 is applied at a time of OFF, the switch can be caused to respond quickly by a low voltage. When a spring constant of the movable electrodes 1011 is set larger than that of the movable electrode 101, a larger spring force can be generated by bending the spring whose spring constant is large.

In order to increase an effect produced by this driving method, another driving electrode can be provided separately under the movable electrodes 1011. When the movable electrodes 1011 are displaced downward by an electrostatic force applied by the driving electrode to come close to the posts of the movable electrodes 1011, an angle at which the movable electrodes 1011 are bent into the vertical direction is made further sharp. Thus, a spring force can be increased. In this case, it is important that the driving electrode should be provided to overlap with at least a range in which the movable electrodes 1011 are displaced downward.

Also, an electrostatic force can be applied simultaneously to the driving electrodes 401 and the driving electrodes 404 at a time of OFF. Hence, a larger electrostatic force directed upward can be applied to the movable electrodes 1011.

In the above embodiment, an example in which the movable electrode having the fixed or simple beam structure is explained. But it is needles to say that the present invention is applicable to the movable electrode having a cantilever structure. The fixed or simple beam structure has such an advantage that a stable structure can be given. But the cantilever structure can relieve a stress, and a change in stress caused due to a temperature change can be avoided. Also, a quick response/lower driving voltage can be achieved by reducing a spring force. When the movable electrodes 1011 are constructed as the cantilever structure, a U-shaped structure including the movable electrode 101 can be employed.

Embodiment 7

The electromechanical switch can be constructed such that the drive of the posts is made by using a heat. When the piezoelectric body 201 of the electromechanical switches shown in FIG. 1A to FIG. 6 is made of the material having an optimum coefficient of thermal expansion and a thermal expansion is utilized in operation, the similar advantages to those in the case of the piezoelectric body can be achieved.

Since a spring constant of the movable electrode 101 is set in a range in which the driving characteristic is not badly influenced, an amount of displacement of the posts can be adjusted along with a temperature change. For example, when the electromechanical switch is employed in such an environment that a temperature rises and a spring constant of the movable electrode 101 is decreased, portions replaced with the piezoelectric body 201 in the posts can be thermally expanded to pull the movable electrode 101 from both sides.

A reduced component of a spring constant can be supplemented by a thermal expansion of the posts to compensate the driving characteristic.

In this case, in the electromechanical switch of the present embodiment, the material such as magnetostrictive material, electrostrictive material, or the like, in which a crystal strain can be induced by an external action, can be employed as the piezoelectric body 201. In the case of the magnetostrictive material, the piezoelectric body 201 is caused to partially displace by applying an external magnetic field and thus the posts can be moved.

Also, a tensile force and a compressive force can be applied to the movable electrode 101 by connecting an piezoelectric-operated actuator, or the like to the supporting portion of the movable electrode 101.

INDUSTRIAL APPLICABILITY

In the electromechanical element according to the present invention, because the supporting bodies for supporting the movable electrode are formed movably and then a releasing force, a tensile force, and a compressive force are applied to the movable electrode, the mechanism for adjusting a spring constant of the movable electrode can be provided to the electromechanical element. Therefore, the quick response/low voltage driven electromechanical element can be accomplished.

Also, because the electromechanical switch can implement a quick response/low voltage drive, such electromechanical switch can be applied to a radio terminal. In particular, a higher performance of a radio terminal used in a situation a temperature or humidity change is caused can be realized.

The invention claimed is:

1. An electromechanical element, comprising:
   a first electrode provided on a substrate;
   a second electrode provided at a predetermined interval to the first electrode so that the interval is changed; and
   supporting portions which support the second electrode,
   wherein the supporting portions of the second electrode suspend the second electrode at a predetermined interval on the first electrode; and
   wherein the supporting portions are able to be displaced, and are able to adjust a spring constant of the second electrode,
   wherein each of the supporting portions includes a piezoelectric element as a post on the substrate, respectively;
   wherein the piezoelectric element is deformed by a piezoelectric strain generated when a voltage is applied to the piezoelectric element; and
   wherein a direction of the piezoelectric strain of the piezoelectric element is oblique to the substrate.

2. The electromechanical element according to claim 1, wherein the supporting portions of the second electrode are displaced in response to a magnitude of an applied voltage.

3. The electromechanical element according to claim 1, wherein the supporting portions have a supporting body, which supports the second electrode, near at least one end of the second electrode.

4. The electromechanical element according to claim 2, wherein the supporting portions are constructed to displace the second electrode, and are able to adjust an amount of the displacement.

5. The electromechanical element according to claim 4, wherein the supporting body is able to be displaced to support the second electrode in a direction perpendicular to the substrate at a different height from a surface of the substrate.

6. The electromechanical element according to claim 4, wherein the supporting body is able to be displaced to support the second electrode in a different position in a parallel direction to a surface of the substrate.

7. The electromechanical element according to claim 4, wherein the supporting body is able to be displaced to extend the second electrode in an oblique direction to the first electrode at the supporting portions of the second electrode.

8. The electromechanical element according to claim 1, wherein a side surface of the piezoelectric element is restrained by an elastic body.

9. The electromechanical element according to claim 4, wherein the supporting body is constructed to displace the second electrode by an electrostatic force.

10. The electromechanical element according to claim 1, wherein the supporting portions includes:
    a first supporting body that is arranged on the substrate to support the second electrode; and
    a second supporting body that is arranged near the first supporting body and is constructed to displace the second electrode by an electrostatic force.

11. The electromechanical element according to claim 10, wherein the second supporting body has a driving electrode that is provided at a predetermined interval to the second electrode so that a potential difference to the second electrode is able to be adjusted.

12. The electromechanical element according to claim 10, wherein the first supporting body is electrically isolated from the second electrode.

13. The electromechanical element according to claim 10, wherein the second supporting body is arranged on an outside of a position that opposes to the first electrode.

14. The electromechanical element according to claim 10, wherein the first supporting body is a column-like structure.

15. The electromechanical element according to claim 1, wherein the supporting portions have a suspending/supporting portion for suspending the second electrode to have an area that opposes to the first electrode, and a supporting body constructed at a predetermined interval from at least one end of the second electrode and provided on the substrate so that a potential difference to the second electrode is able to adjusted respectively.

16. The electromechanical element according to claim 1, wherein the supporting portions are formed to support both ends of the second electrode.

17. The electromechanical element according to claim 1, wherein the second electrode has a H-shaped structure.

18. The electromechanical element according to claim 1, further comprising:
    an adjusting mechanism which is able to adjust an amount of displacement of the supporting portions in response to a using environment is provided.

19. The electromechanical element according to claim 18, further comprising:
    a using environment sensing portion,
    wherein the adjusting mechanism is able to adjust an amount of displacement based on a sensed result of the using environment sensing portion.

20. The electromechanical element according to claim 19, wherein the using environment sensing portion has a temperature sensor.

21. The electromechanical element according to claim 19, wherein the using environment sensing portion has a humidity sensor.

22. An electromechanical element according to claim 1, wherein the piezoelectric element is a piezoelectric body which is put between electrodes formed via an adhesion layer on the substrate.

23. An electromechanical element according to claim 1, wherein the piezoelectric element is a piezoelectric body which is put between electrodes formed on the substrate.

* * * * *